US008791847B1

(12) United States Patent
Wang et al.

(10) Patent No.: US 8,791,847 B1
(45) Date of Patent: Jul. 29, 2014

(54) SIGMA-DELTA MODULATOR WITH TRIMMED REFERENCE VOLTAGE FOR QUANTIZER

(71) Applicants: Peijun Wang, Austin, TX (US); Robert S. Jones, Austin, TX (US)

(72) Inventors: Peijun Wang, Austin, TX (US); Robert S. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/748,796

(22) Filed: Jan. 24, 2013

(51) Int. Cl.
*H03M 3/00* (2006.01)

(52) U.S. Cl.
USPC .......................................... 341/143; 341/121

(58) Field of Classification Search
USPC ................... 341/118–121, 155, 143
See application file for complete search history.

(56) References Cited

U.S. PATENT DOCUMENTS 7,113,749 B2 * 9/2006 Smith et al. ................ 455/67.11
7,852,253 B2   12/2010 Bien et al.
7,855,668 B2 * 12/2010 Akizuki et al. ............... 341/143

OTHER PUBLICATIONS

Pan, J., et al., "A Sigma-Delta Class D Audio Power Amplifier in 0.35 um CMOS Technology", IEEE, 2008 International SoC Design Conference, pp. 5-8.
Morgado, A., et al., "Nanometer CMOS Sigma-Delta Modulators for Software Defined Radios", Springer, Mar. 2011, Manual, pp. 1-297.
Kim, M.G., et al., "A 0.9v 92dB Double-Sampled Switched-RC Delta Sigma Audio ADC," IEEE, Journal of Solid-State Circuits, vol. 43, No. 5, May 2008, pp. 1195-1206.

* cited by examiner

*Primary Examiner* — Brian Young
(74) *Attorney, Agent, or Firm* — Mary Jo Bertani; James L. Clingan, Jr.

(57) ABSTRACT

A sigma delta modulator includes a first circuit that receives an analog signal and provides an intermediate signal and a first quantizer signal and further includes a first quantizer that receives the first quantizer signal and provides a first quantizer output. Also included are a second input circuit that receives the intermediate signal and provides a second quantizer signal and a second quantizer that receives the second quantizer signal and provides a second quantizer output. The first quantizer includes a programmable circuit having a first reference and a negative of the first reference, a first comparator having a first input coupled to the first quantizer signal, a second input coupled to the first reference and a second comparator having a second input coupled to the first quantizer signal a second input coupled to the negative. The first and second comparators have outputs that form the output of the first quantizer.

16 Claims, 3 Drawing Sheets

SIGMA-DELTA MODULATOR WITH TRIMMED REFERENCE VOLTAGE FOR QUANTIZER

BACKGROUND

1. Field

This disclosure relates generally to semiconductor devices, and more specifically, to sigma-delta modulators with trimmed quantizer reference voltage.

2. Related Art

Analog-to-digital converters (ADC's) are employed in a variety of demanding applications including computer systems, wireless telephones, and power metering systems. Such applications demand cost-effective ADC's that can efficiently convert an analog input signal to digital output signal over a wide range of frequencies and signal magnitudes with minimal noise and distortion.

An ADC typically converts an analog signal to a digital signal by sampling the analog signal at predetermined sampling intervals and generating a sequence of binary numbers via a quantizer in response thereto. The sequence of binary numbers is a digital signal representation of the sampled analog signal.

The length of a binary number assigned to a given sampled value of the analog signal corresponds to the number of quantizer bits and is limited. Consequently, a digital sample will not always precisely represent the corresponding analog sample. The difference between a digital sample and the corresponding analog sample represents quantization error.

The sampling frequency of the ADC is the inverse of the sampling interval. The resolution of the ADC is directly related to the number of binary bits assigned to each sampled value and inversely related to quantization error. The minimum difference between successive values that may be represented by the quantizer is the quantization step size. Quantization error results in quantization noise in the output digital signal, which is also called granular noise.

One measure of the performance of the sigma-delta modulator is the signal to noise and distortion ratio, which is a ratio of the power of a portion of the output signal that excludes quantization error, noise and distortion to the power of the sum of quantization error, noise and distortion and is expressed in decibels. The higher the number the number of decibels, the better the performance of the sigma-delta modulator. The quantization error is introduced by rounding or truncating the difference between the analog signal and the digital signal. One way to improve performance is to use quantizers with higher numbers of detection levels. The higher levels of detection in quantizers have increased complexity and require a greater number of components. Yet it is desirable to reduce the number of components required to achieve the desired performance.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein provide a sigma-delta modulator with reference voltages that are trimmed to increase the accuracy of the quantized signal. The trimmed reference voltages improve the performance of the sigma-delta modulator using quantizers with fewer detection levels than would otherwise be necessary to achieve similar performance.

Figure 1:
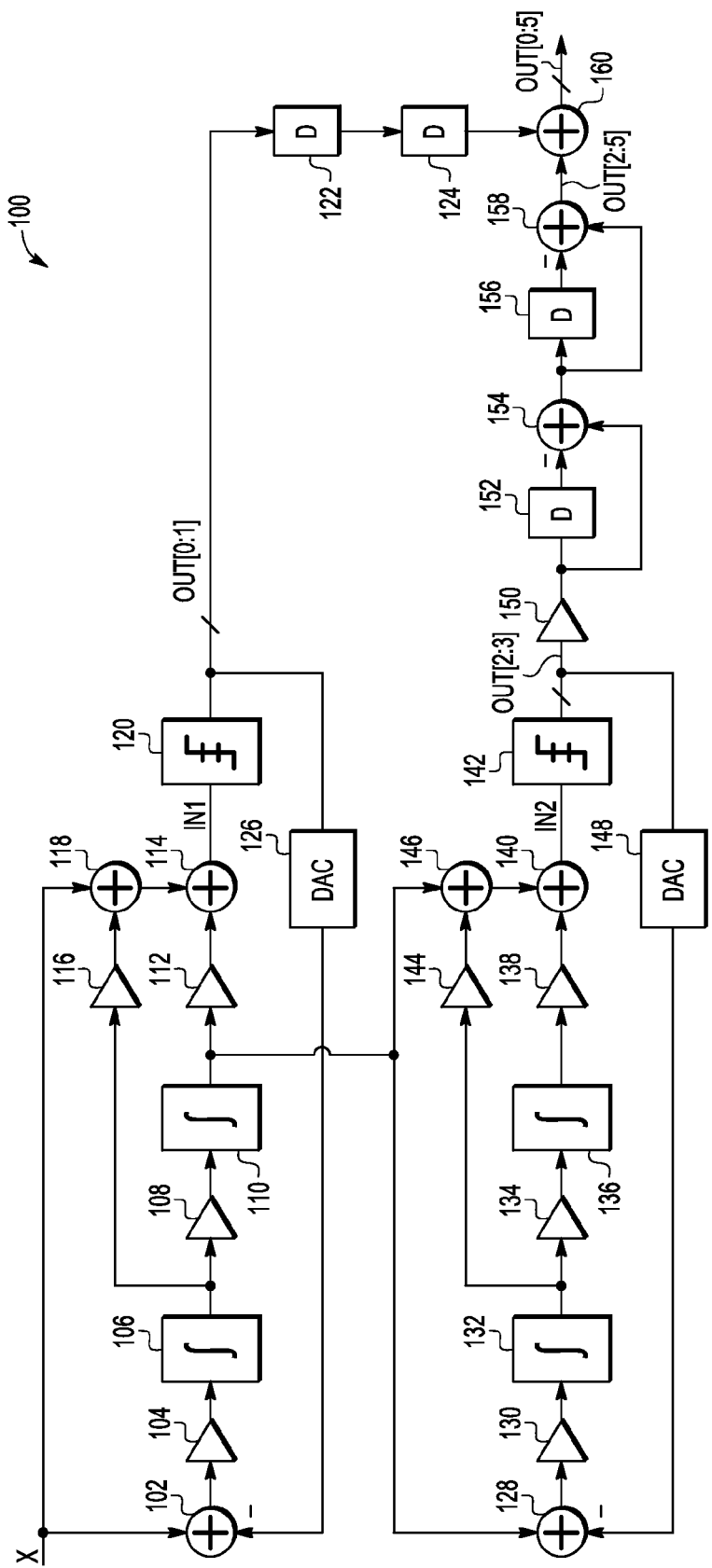
FIG. 1 is a schematic diagram of an embodiment of a sigma-delta modulator.

FIG. 1 is a schematic diagram of an embodiment of a two stage second order sigma-delta modulator 100 including a first stage with summing junction 102, gain factor or gain stage 104, integrator 106, gain stage 108, integrator 110, gain stage 112, summing junction 114, gain stage 116, summing junction 118, quantizer 120, delay circuits 122, 124, and digital to analog converter 126. A second stage of modulator 100 includes summing junction 128, gain factor or gain stage 130, integrator 132, gain stage 134, integrator 136, gain stage 138, summing junction 140, quantizer 142, gain stage 144, summing junction 146, digital to analog converter (DAC) 148, gain stage 150, summing junctions 154, 158, and delay circuits 152, 156.

Input to summing junction 102 includes an analog signal X and a feedback signal from quantizer 120 that has been converted from a digital signal to an analog signal by digital to analog converter (DAC) 126. The output of summing junction 102 is the difference between analog signal X and the analog feedback signal from DAC 126. Gain stage 104, integrator 106, gain stage 108, integrator 110, and gain stage 112 are connected in series to one another in sequence. The output of gain stage 112 is input to summing junction 114. The input to gain stage 116 is the output of integrator 106. The output of gain stage 116 is added to the analog input signal at summing junction 118. The output of summing junction 118 is added to the output of gain stage 112 at summing junction 114. The output of summing junction 114 is shown as signal IN1 input to quantizer 120. The output of quantizer 120 is input to delay circuits 122. The output of delay circuit 122 is provided to delay circuit 124. The output of delay circuit 124 is the output of the first stage of sigma-delta modulator 100.

At the start of the second stage of sigma-delta modulator 100, input to summing junction 128 includes the output of integrator 110 and a feedback signal from quantizer 142 that has been converted from a digital signal to an analog signal by DAC 148. The output of summing junction 128 is the difference between the output of integrator 110 and the analog feedback signal from DAC 148. Gain stage 130, integrator 132, gain stage 134, integrator 136, and gain stage 138 are connected in series to one another in sequence. The output of gain stage 138 is input to summing junction 140. The input to gain stage 144 is the output of integrator 132. The output of gain stage 144 is added to the output of integrator 110 at summing junction 146. The output of summing junction 146 is added to the output of gain stage 138 at summing junction 140. The output of summing junction 140 is shown as signal IN2 input to quantizer 142. The output of quantizer 142 is input to gain stage 150. The output of gain stage 150 is input to delay circuit 152. The output of delay circuit 152 is subtracted from the output of gain stage 150 at summing junction 154. The output of summing junction 154 is input to delay circuit 156. The output of delay circuit 156 is subtracted from the output of summing junction 154 at summing junction 158 to generate the output of the second stage of sigma-delta modulator 100. The output of the first stage of sigma-delta modulator 100 is added to the output of the second stage of sigma-delta modulator 100 at summing junction 160 to generate output signal OUT. Quantizers 120, 142 can output two bits each. The number of bits output by summing junction 160 can therefore include a total of six bits since summing junctions 154, 158 add two bits to the output signal OUT[0:5].

Modulator 100 is comprised of CMOS components that are ever-decreasing in size and are subject to variations in manufacturing. Additionally, as the levels of voltages used in CMOS semiconductor devices decreases, the manufacturing variations may cause wide variations in performance between devices while it is desirable for the devices to show consistent performance. To achieve consistent high performance despite manufacturing variations, the reference voltage used by quantizers 120, 142 is trimmed to maximize the signal to noise plus distortion ratio of the output of modulator 100 instead of using a default reference voltage available to modulator 100.

Figure 2:
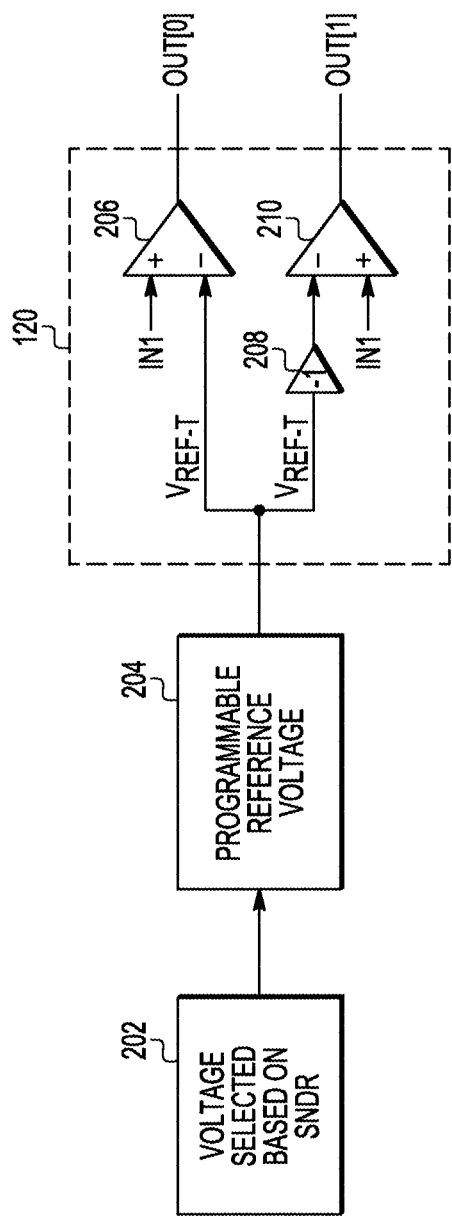
FIG. 2 is a schematic diagram of an embodiment of a quantizer that can be used in the sigma-delta modulator of FIG. 1.

FIG. 2 is a schematic diagram of an embodiment of quantizer 120 coupled to voltage selected based on signal to noise plus distortion ratio module (SNDR module) 202 and programmable reference voltage module 204 that can be used in the sigma-delta modulator 100 of FIG. 1. Quantizer 120 is coupled to receive VREF-T from programmable reference voltage module 204. Programmable reference voltage module 204 receives a selected voltage from SNDR module 202. SNDR module 202 can evaluate data from a test run in which modulator 100 is operated using a range of reference voltages in quantizer 120 to determine the reference voltage for quantizer 120 that achieves the highest SNDR for modulator 100. SNDR module 202 provides the selected reference voltage to programmable reference voltage module 204.

Figure 3:
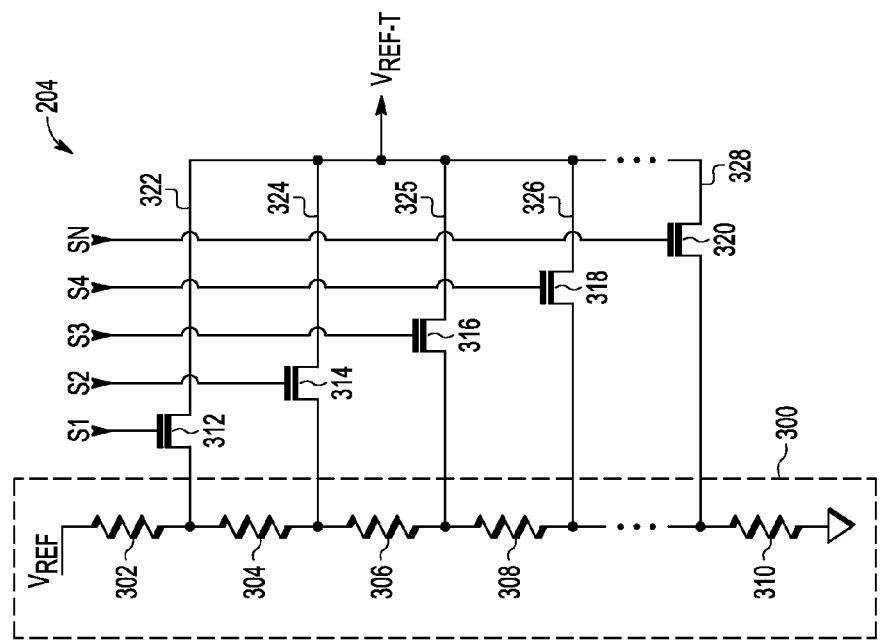
FIG. 3 is a schematic diagram of an embodiment of a programmable reference voltage circuit that can be used with the quantizer of FIG. 2.

Referring to FIGS. 2 and 3, FIG. 3 shows a schematic diagram of an embodiment of a programmable reference voltage circuit that can be used with the quantizer 120 including a resistor ladder 300 with resistors 302-310 coupled in series and a series of voltage taps 322-328 coupled between respective resistors 302-310. Each voltage tap is coupled to a respective selection switch 312-320. The voltage taps 322-328 are tied together at the output of switches 312-330 at a node from which trimmed reference voltage VREF-T is available. A reference voltage VREF is supplied at the top of resistor ladder 300 before the first resistor 302. The voltage at each tap is reduced from the voltage at the preceding tap by a corresponding one of resistors 302-310. Based on the selected reference voltage from SNDR module 202, a corresponding one or more of switches 312-320 can be operated to supply a trimmed reference voltage VREF-T to quantizer 120 that corresponds as closely as possible to the selected reference voltage from SNDR module 202.

In the example shown, quantizer 120 is a three level or 1.5 bit quantizer including comparators 206, 210 and minus one gain factor 208 at the negative terminal of comparator 210. Input voltage IN1 is provided to the positive terminals of comparators 206, 210, and trimmed reference voltage VREF-T is provided to the negative terminal of comparator 206. The complement of trimmed reference voltage VREF-T formed after trimmed reference voltage VREF-T passes through minus one gain factor 208 is provided at the negative terminal of comparator 210. The output of comparator 206 is a single bit signal OUT[0]. The output of comparator 210 is also a single bit signal OUT[1].

While resistor ladder 300 is shown as a means for generating different levels of voltage for selection as VREF-T, other mechanisms for generating or supplying different level of voltage, such as a series of fuses, inductors, capacitors, or other components, can be used instead of or in addition to resistor ladder 300. Further, although resistor ladder 300 is shown with 5 resistors 302-310, any suitable number of resistors or other components can be used.

Selection switches 312-320 can be implemented using any suitable component capable of operating to make a respective voltage available at the VREF-T node or to prevent the respective voltage from being available at the VREF-T node. In the example shown, switches 312-320 are implemented with N-channel transistors having a drain electrode coupled to resistor ladder 300 and a source electrode coupled to the VREF-T node. Control gates are coupled to respective control signals S1-SN that are set to activate or de-activate conduction in the transistors. The values of signals S1-SN may be set by SNDR module 202, programmable reference voltage module 204, or other suitable component.

The process of setting signals S1-SN can be performed when modulator 100 is being tested before modulator 100 or a device that includes modulator 100 is delivered to an end user. The setting for signals S1-SN may be stored or programmed in non-volatile memory (not shown) that is accessible by modulator 100, or a mechanism for permanently allowing voltage to be available on each of the taps, such as using programmable fuses for switches 312-320, can be used.

Reference voltage for quantizer 142 can also be trimmed by testing the performance of modulator 100 over a range of reference voltages for quantizer 142 and using SNDR module 202 and a corresponding programmable reference voltage module 204 to determine and supply a trimmed reference voltage to quantizer 142. The trimmed reference voltage can be the same or different than the trimmed reference voltage for quantizer 120, depending on the difference in performance between quantizer 120 and quantizer 142 without the trimmed reference voltage. If quantizers 120 and 142 have similar performance without the trimmed reference voltage, then the same reference voltage can be used for both quantizer 120 and 142, otherwise, a different trimmed reference voltage may be used for each.

Figure 4:
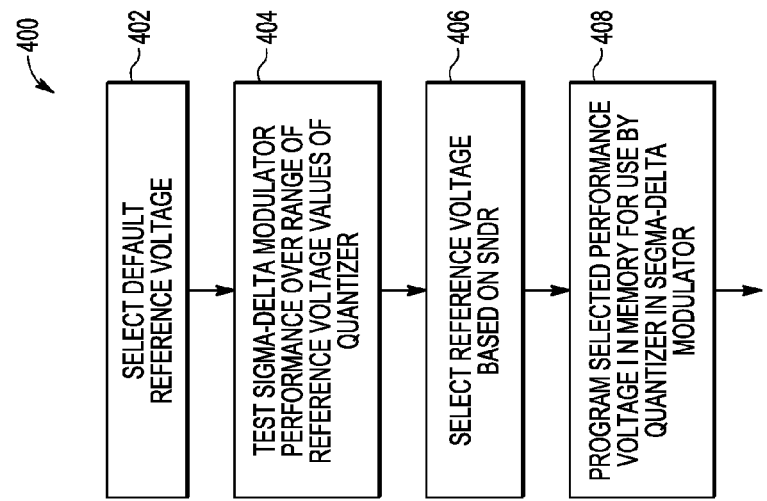
FIG. 4 is a flow diagram of an embodiment of a method for trimming reference voltage used by the quantizer of FIG. 2.

Referring to FIGS. 1 and 4, FIG. 4 is a flow diagram of an embodiment of a method 400 for trimming reference voltage used by the quantizers 120, 142 of FIG. 1. Process 402 can include selecting a default or starting value for a reference voltage to be used in one or both of quantizers 120, 142. Note that quantizers 120, 142 can be tested separately or simultaneously. The initial reference voltage can be the lowest, highest, or an intermediate value that can be used in the quantizers 120, 142.

Process 404 includes testing modulator 100 over a range of values for the reference voltage used in quantizers 120, 142. The range can cover from the lowest to the highest reference voltages available. Data on the performance of modulator 100 is taken at each reference voltage and at least temporarily stored so that performance of modulator 100 at each reference voltage tested can be compared in process 406. One measure of performance that can be used is the signal to noise and distortion ratio, which is a ratio of the power of a portion of the output signal that excludes quantization error, noise and distortion to the power of the sum of quantization error, noise and distortion. SNDR is expressed in decibels. The higher the number the number of decibels, the better the performance of the sigma-delta modulator. Thus, the reference voltage that maximizes the SNDR of modulator 100 can be selected as the reference voltage to be used by the quantizers 120, 142 during normal operation.

Process 408 can include programming the selected or trimmed reference voltage for the quantizers 120, 142. In some implementations, the trimmed reference voltage VREF-T can be programmed using a resistance ladder 300 and a series of switches 312-320 on voltage taps 322-328 on the resistance ladder 300, such as shown in FIG. 3. In other implementations, the trimmed reference voltage can be programmed using fuses, or switched capacitors or inductors. Other suitable techniques for adjusting a reference voltage supplied to modulator 100 to a trimmed reference voltage used by quantizers 120, 142, can be used.

Process 400 can be implemented in a test station that is connected to supply test values for reference voltages to modulator 100, as well as to receive performance information from modulator 100 to determine the SNDR and/or other parameters that can be used to determine a trimmed reference voltage to be used by quantizers 120, 142 to optimize the performance of modulator 100. The test station may be used to run automated tests on components at the die or wafer stage and thus provides testing signals and processes results of the tests. Tester station may be programmed to run functions that arise as needed from the test results.

By now it should be appreciated that in some embodiments there has been provided a sigma delta modulator (100) that can comprise a first input circuit (102, 104, 106, 108, 110, 112, 114, 116, 118) that receives an analog signal and provides an intermediate signal (between 110 and 112) and a first quantizer signal. A first quantizer (120) can receive the first quantizer signal and provides a first quantizer output. A first output circuit (122, 124) can have an input that receives the first quantizer output and provide a first processed signal to a summer (160). A second input circuit (128, 130, 132, 134, 136, 138, 140, 144, 146) can receive the intermediate signal and provide a second quantizer signal. A second quantizer (142) can receive the second quantizer signal and provide a second quantizer output. A second output circuit (150, 152, 154, 156, 158) can have an input that receives the second quantizer output and provides a second processed signal to the summer. The first quantizer can comprise a programmable reference voltage circuit (204, 208) having a first reference output and a negative of the first reference output, a first comparator (206) having a first input coupled to the first quantizer signal, a second input coupled to the first reference output, and an output as a first portion of the first quantizer output, and a second comparator (208) having a second input coupled to the first quantizer signal, a second input coupled to the negative of the first reference output, and an output as a second portion of the first quantizer output.

In another aspect, the sigma delta modulator can further comprise a voltage selector (202) programmed to select a magnitude of the first reference output and of the negative of the first reference output.

In another aspect, the voltage selector can comprise a plurality of fuses.

In another aspect, the voltage selector can comprise a non volatile memory.

In another aspect, the programmable reference voltage circuit can comprise a plurality of resistors (302, 304, 306, 308, 310)) coupled in series.

In another aspect, the first reference output can be applied as a voltage across a selected terminal (Vref–out) and a reference terminal (ground) of the plurality of resistors and the negative of the first reference output is applied as a reverse of the selected terminal and the reference terminal.

In another aspect, the first reference output can be a applied to a negative terminal of the first comparator, the negative of the first reference output can be applied to a negative terminal of the second comparator, and the first quantizer signal can be coupled to a positive input of the first comparator and a positive input of the second comparator.

In another aspect, the first input circuit can comprise a first summer (102) for receiving the analog signal, further comprising a digital to analog converter (126) having an input coupled to the first quantizer output and an output coupled to the first summer.

In another aspect, the first input circuit can further comprise sequential integrators (106, 110), coupled to the first summer, that provide the intermediate output; and the second input circuit can comprise a second summer (128) that receives the intermediate output.

In another aspect, a non-volatile storage circuit (202) programmable externally from the sigma delta modulator can provide an output to the programmable reference voltage circuit. The programmable reference voltage circuit responds to the output of the non-volatile storage circuit by providing the first reference output and the negative of the first reference output at a magnitude selected externally from the sigma delta modulator.

In other embodiments, a method of operating (400) a quantizer (120) of a sigma delta modulator (100) can comprise selecting (408) a reference output (Vref) and a negative of the reference output (output of 208) from among a plurality of reference outputs and negatives of the reference outputs based on a performance of the sigma delta modulator using the plurality of reference outputs and negatives of the reference outputs; and performing a quantizer operation on a quantizer signal to produce a quantizer output using the selected reference output and negative of the reference output.

In another aspect, the selecting can be further characterized by storing (408) selector information to indentify the selected reference output and negative of the reference output.

In another aspect, the storing can be performed in fuses.

In another aspect, the storing can be performed in a non-volatile memory.

In another aspect, the performance can comprise a determination of a maximum signal to noise-plus-distortion ratio (406).

In another aspect, the selecting can comprise running experiments (402 and 404) using the plurality of reference outputs and negatives of the reference outputs to determine an optimum reference output and negative of the reference output.

In another aspect, the selecting can be further characterized by storing the optimum reference output and negative of the reference output in non-volatile storage.

In still other embodiments, a sigma delta modulator (100) includes a quantizer (120) that can comprise a programmable reference voltage circuit (204, 208) that provides a reference voltage and a negative of the reference voltage at a magnitude selected by an input to the programmable reference voltage circuit. A first comparator (206) can have an input for being coupled to a partially processed analog signal (IN1), a second input that receives the reference voltage, and an output as a first portion of an output of the quantizer. A second comparator (210) can have an input for being coupled to the partially processed analog signal, a second input that receives the negative of the reference voltage, and an output as a second portion of the output of the quantizer.

In another aspect, a voltage selector (202) can provide the input to the programmable reference voltage circuit that selects the magnitude of the reference voltage and negative of the reference voltage.

In another aspect, the voltage selector can comprise non-volatile storage that is loaded externally from the sigma delta modulator.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Alternatively, system 100 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A sigma delta modulator, comprising:
    a first input circuit that receives an analog signal and provides an intermediate signal and a first quantizer signal;
    a first quantizer that receives the first quantizer signal and provides a first quantizer output;
    a first output circuit that has an input that receives the first quantizer output and provides a first processed signal to a summer;
    a second input circuit that receives the intermediate signal and provides a second quantizer signal;
    a second quantizer that receives the second quantizer signal and provides a second quantizer output; and
    a second output circuit that has an input that receives the second quantizer output and provides a second processed signal to the summer,
    wherein the first quantizer comprises:
        a programmable reference voltage circuit having a first reference output and a negative of the first reference output;
        a first comparator having a first input coupled to the first quantizer signal, a second input coupled to the first reference output, and an output as a first portion of the first quantizer output; and
        a second comparator having a second input coupled to the first quantizer signal, a second input coupled to the negative of the first reference output, and an output as a second portion of the first quantizer output.

2. The sigma delta modulator of claim 1, further comprising a voltage selector programmed to select a magnitude of the first reference output and of the negative of the first reference output.

3. The sigma delta modulator of claim 2, wherein the voltage selector comprises a plurality of fuses.

4. The sigma delta modulator of claim 2, wherein the voltage selector comprises a non volatile memory.

5. The sigma delta modulator of claim 2, wherein the programmable reference voltage circuit comprises a plurality of resistors coupled in series.

6. The sigma delta modulator of claim 5, wherein the first reference output is applied as a voltage across a selected terminal and a reference terminal of the plurality of resistors and the negative of the first reference output is applied as a reverse of the selected terminal and the reference terminal.

7. The sigma delta modulator of claim 6, wherein the first reference output is a applied to a negative terminal of the first comparator, the negative of the first reference output is applied to a negative terminal of the second comparator, and the first quantizer signal is coupled to a positive input of the first comparator and a positive input of the second comparator.

8. The sigma delta modulator of claim 1, wherein the first input circuit comprises a first summer for receiving the analog signal, further comprising a digital to analog converter having an input coupled to the first quantizer output and an output coupled to the first summer.

9. The sigma delta modulator of claim 8, wherein:
the first input circuit further comprises sequential integrators, coupled to the first summer, that provide the intermediate output; and
the second input circuit comprises a second summer that receives the intermediate output.

10. The sigma delta modulator of claim 1 further comprising a non-volatile storage circuit programmable externally from the sigma delta modulator that provides an output to the programmable reference voltage circuit, wherein the programmable reference voltage circuit responds to the output of the non-volatile storage circuit by providing the first reference output and the negative of the first reference output at a magnitude selected externally from the sigma delta modulator.

11. A method of operating a quantizer of a sigma delta modulator, comprising:
selecting a reference output and a negative of the reference output from among a plurality of reference outputs and negatives of the reference outputs based on a performance of the sigma delta modulator using the plurality of reference outputs and negatives of the reference outputs, the selecting includes running experiments using the plurality of reference outputs and negatives of the reference outputs to determine an optimum reference output and negative of the reference output, and storing the optimum reference output and negative of the reference output in non-volatile storage; and
performing a quantizer operation on a quantizer signal to produce a quantizer output using the selected reference output and negative of the reference output.

12. The method of claim 11, wherein the selecting is further characterized by storing selector information to indentify the selected reference output and negative of the reference output.

13. The method of claim 12, wherein the storing is performed in fuses.

14. The method of claim 12, wherein the storing is performed in a non-volatile memory.

15. The method of claim 12, wherein the performance comprises a determination of a maximum signal to noise-plus-distortion ratio.

16. A sigma delta modulator having a quantizer, wherein the quantizer comprises:
a programmable reference voltage circuit that provides a reference voltage and a negative of the reference voltage at a magnitude selected by an input to the programmable reference voltage circuit;
a first comparator having an input for being coupled to a partially processed analog signal, a second input that receives the reference voltage, and an output as a first portion of an output of the quantizer;
a second comparator having an input for being coupled to the partially processed analog signal, a second input that receives the negative of the reference voltage, and an output as a second portion of the output of the quantizer;
a voltage selector that provides the input to the programmable reference voltage circuit that selects the magnitude of the reference voltage and negative of the reference voltage, wherein the voltage selector comprises non-volatile storage that is loaded externally from the sigma delta modulator.

* * * * *